United States Patent [19]
Tanemura

[11] Patent Number: 5,994,964
[45] Date of Patent: Nov. 30, 1999

[54] GAIN-CONTROL-TYPE TRANSISTOR POWER AMPLIFIER

[75] Inventor: Takeshi Tanemura, Fukushima-ken, Japan

[73] Assignee: Alps Electric Co., Ltd., Japan

[21] Appl. No.: 08/975,241

[22] Filed: Nov. 21, 1997

[30] Foreign Application Priority Data

Nov. 22, 1996 [JP] Japan ..................................... 8-312212

[51] Int. Cl.⁶ ..................................................... H03G 3/30
[52] U.S. Cl. ............................................................ 330/285
[58] Field of Search ................................... 330/278, 279, 330/285

[56] References Cited

U.S. PATENT DOCUMENTS

| | | | |
|---|---|---|---|
| 3,395,357 | 7/1968 | Ketchledge | 330/285 |
| 3,546,616 | 12/1970 | Hargasser et al. | 330/285 |
| 5,023,569 | 6/1991 | Raven | 330/285 |
| 5,455,468 | 10/1995 | Pham | 330/285 X |

FOREIGN PATENT DOCUMENTS 8-274557  10/1996  Japan .

Primary Examiner—Steven J. Mottola
Attorney, Agent, or Firm—Brinks Hofer Gilson & Lione

[57] ABSTRACT

A gain-control-type transistor power amplifier is provided which performs gain control in a state in which there is satisfactory linearity by extending the varying range of a gain control voltage capable of controlling the output level of an RF signal. The gain-control-type transistor power amplifier includes an amplifying transistor, to the base of which a bias voltage and an amplification signal are supplied, and a control transistor, to the base of which a gain control voltage is supplied. The gain control voltage output from the emitter of the control transistor is supplied to the base of the amplifying transistor in such a manner as to be superposed onto the base bias, and the base bias voltage is varied by the supplied gain control voltage, controlling the gain of the amplifying transistor and the output level of the RF signal.

2 Claims, 4 Drawing Sheets

GAIN-CONTROL-TYPE TRANSISTOR POWER AMPLIFIER

BACKGROUND OF THE INVENTION

1. Field of the Invention

The present invention relates to a gain-control-type transistor power amplifier. More particularly, the present invention relates to a gain-control-type transistor power amplifier suitable for adjusting an output signal level of a power amplifier for transmission disposed in a transmission and receiving unit on a subphone side of a digital cordless telephone set.

2. Description of the Related Art

Hitherto, digital cordless telephone sets transmit and receive signals on a time-division basis using the same frequency between the base phone and subphones. In particular, on the subphone side, when a signal from the base phone is received, a received signal intensity indicating the received signal level is detected, and when a signal is transmitted, the gain of the transmission power amplifier is controlled according to the detected received signal intensity so that the transmission signal level is controlled, and this controlled signal is transmitted to the base phone side. In this case, when the received signal intensity is increased, control is performed so that the gain of the transmission power amplifier is decreased, and the transmission signal level is decreased. On the other hand, when the received signal intensity is decreased, the gain of the transmission power amplifier is increased, and the transmission signal level is increased so that the consumption of the built-in battery which drives the subphone is reduced as low as possible.

In this case, all the components of the the subphone of the above-described known digital cordless telephone set are formed of small circuit elements, such as transistors. The subphone comprises a transmission section, formed of a transistor power amplifier, a frequency mixer, a filter, and the like, which constitute a transmission power amplifier, a receiving section, formed of a transistor receiving amplifier, a frequency mixer, a filter, and the like, which constitute a receiving amplifier, and a transmission and receiving common section formed of a phase control loop (PLL) including a transmission and receiving select switch, a filter and a voltage controlled oscillator (VCO), and others. These components of the transmission section, the receiving section, and the transmission and receiving common section are formed into one unit and disposed within a transmission and receiving unit (TR unit).

FIG. 4 is a circuit diagram illustrating an example of a gain-control-type transistor power amplifier for use in the transmission section of the known digital cordless telephone set.

As shown in FIG. 4, the gain-control-type transistor power amplifier comprises a pre-amplifying transistor 41 which is emitter-grounded, a power amplifying transistor 42 which is similarly emitter-grounded, an input filter circuit 43 formed of a series resistor 43a, a series inductor 43b and a branch capacitor 43c, first and second coupling capacitors 44 and 45, a first collector load 46 formed of a series-connected inductor 46a, a resistor 46b and a branch capacitor 46c, an interstage filter circuit 47 formed of a series inductor 47a and a branch capacitor 47b, a third coupling capacitor 48, a second collector load 49 formed of a series inductor 49a and a branch capacitor 49b, an output filter circuit 50 formed of a series inductor 50a and a branch capacitor 50b, a fourth coupling capacitor 51, a first base bias circuit 52 formed of a series inductor 52a and a branch capacitor 52b, a second base bias circuit 53 formed of a series resistor 53a and a branch capacitor 53b, a signal input terminal 54, a signal output terminal 55, a power terminal 56 on the high voltage side, a power terminal 57 on the low voltage side, and a gain-control-voltage supply terminal 58.

The pre-amplifying transistor 41 is connected at its base to the signal input terminal 54 via the second coupling capacitor 45 and the first coupling capacitor 44 and further connected to the gain-control-voltage supply terminal 58 via the first base bias circuit 52, and is connected at its collector to the power terminal 56 on the high voltage side via the first collector load 46 and further connected to the base of the power amplifying transistor 42 via the interstage filter circuit 47 and the third coupling capacitor 48. The power amplifying transistor 42 is connected at its base to the power terminal 57 on the low voltage side via the second base bias circuit 53, and is connected at its collector to the power terminal 56 on the high voltage side via the second collector load 49 and further connected to the signal output terminal 55 via the output filter circuit 50 and the fourth coupling capacitor 51.

In this case, a radio frequency signal (hereinafter referred to as an "RF signal") to be amplified is supplied to the signal input terminal 54, and the amplified RF signal is output from the signal output terminal 55. A relatively high power voltage is supplied to the power terminal 56 on the high voltage side, and a relatively low power voltage is supplied to the power terminal 57 on the low voltage side. A gain control voltage which varies in response to the received signal intensity is supplied to the gain-control-voltage supply terminal 58, and the varying range of the gain control voltage is, for example, from 0 to 1.5 V.

The gain-control-type transistor power amplifier constructed as described above operates as described below.

An RF signal to be amplified, which is applied to the signal input terminal 54, is supplied to the base of the pre-amplifying transistor 41 via the first coupling capacitor 44, the input filter circuit 43, and the second coupling capacitor 45, is pre-amplified by the pre-amplifying transistor 41 and output from the collector thereof. At this time, the amplification gain of the pre-amplifying transistor 41 becomes a variable gain, which is dependent on the magnitude of the gain control voltage applied to the gain-control-voltage supply terminal 58. Then, the RF signal pre-amplified by the pre-amplifying transistor 41 is supplied to the base of the power amplifying transistor 42 via the interstage filter circuit 47 and the third coupling capacitor 48, and is power-amplified by the power amplifying transistor 42 and output from the collector thereof. In this case, the amplification gain of the power amplifying transistor 42 becomes a fixed gain, which is dependent on a power voltage applied to the power terminal 57 on the low voltage side. Then, the RF signal which is power-amplified by the power amplifying transistor 42 is supplied to the signal output terminal 55 via the output. filter circuit 50 and the fourth coupling capacitor 51, is output from the signal output terminal 55 through a transmission and receiving select switch (not shown) to an antenna (also not shown) and transmitted.

Meanwhile, the amplification gain of the RF signal in this known gain-control-type transistor power amplifier, namely, the RF signal level output from the signal output terminal 55, depends on the magnitude of the gain control voltage applied to the gain-control-voltage supply terminal 58. In this case, the gain control voltage varies according to the RF signal level (received signal intensity) received by the receiving section of the digital cordless telephone set. When the received signal intensity is large, the gain control voltage decreases. When, on the other hand, the received signal intensity is small, the gain control voltage increases. The varying range is in a range from 0 to 1.5 V.

FIG. 2 is a characteristic view illustrating an example of the relationship between the gain control voltage and the RF signal output level in the gain-control-type transistor power amplifier. FIG. 3 is a characteristic view illustrating an example of the relationship between the gain control voltage and the base voltage of the pre-amplifying transistor in the gain-control-type transistor power amplifier.

In FIG. 2, the horizontal axis indicates the gain control voltage (V) applied to the gain-control-voltage supply terminal, and the vertical axis indicates the RF signal output level (dBm) output from the signal output terminal.

In FIG. 3, the horizontal axis indicates the gain control voltage (V) applied to the gain-control-voltage supply terminal, and the vertical axis indicates the base voltage (V) of the pre-amplifying transistor.

In the above-described known gain-control-type transistor power amplifier, initially, when the gain control voltage applied to the gain-control-voltage supply terminal 58 is from 0 to 0.5 V, as indicated by curve B of FIG. 3, the base voltage of the pre-amplifying transistor 41 does not reach the base-emitter junction voltage (Vbe≈0.6 V) of the transistor 41. Therefore, the pre-amplifying transistor 41 is in a cut-off state, and an RF signal is not output, as indicated by curve B of FIG. 2.

Next, when the gain control voltage applied to the gain-control-voltage supply terminal 58 exceeds 0.5 V, as indicated by curve B of FIG. 3, the base voltage of the pre-amplifying transistor 41 increases sequentially with an increase in the gain control voltage, and in response to this, the output level of the RF signal increases sharply, as indicated by curve B of FIG. 2.

At this time, when the gain control voltage applied to the gain-control-voltage supply terminal 58 increases to about 0.8 V, as indicated by curve B of FIG. 3, the base voltage of the pre-amplifying transistor 41 increases sequentially with an increase in the gain control voltage; however, as indicated by curve B of FIG. 2, the output level of the RF signal, which until then was in a sharply increasing state, becomes dull, and in a stage in which the gain control voltage exceeds 0.8 V, the output level of the RF signal saturates with respect to an increase in the gain control voltage thereafter.

Further, when the gain control voltage applied to the gain-control-voltage supply terminal 58 exceeds 1.0 V, although, as indicated by curve B of FIG. 3, the base voltage of the pre-amplifying transistor 41 continues to increase sequentially with an increase in the gain control voltage, as indicated by the curve B of FIG. 2, the output level of the RF signal, which until then was in a saturated state, decreases conversely, and moreover, the rate of decrease is quite sharp.

Thereafter, when the gain control voltage applied to the gain-control-voltage supply terminal 58 increases to about 1.3 V, as indicated by curve B of FIG. 3, the base voltage of the pre-amplifying transistor 41 approaches a saturated state in which the base voltage does not increase greatly with an increase in the gain control voltage, and as indicated by curve B of FIG. 2, the output level of the RF signal becomes almost zero regardless of the gain control voltage.

As described above, the known gain-control-type transistor power amplifier is capable of controlling the output level of the RF signal in a range from −10 to +20 dBm in a range in which the gain control voltage applied to the gain-control-voltage supply terminal 58 is from 0.5 to 0.8 V.

In the above-described known gain-control-type transistor power amplifier, since the output impedance of a control integrated circuit (IC) which supplies a gain control voltage to the gain-control-voltage supply terminal 58 is relatively high, the base bias current based on the gain control voltage supplied to the base of the pre-amplifying transistor 41 cannot be increased. For example, since the base bias current is a maximum of approximately 1 mA, the gain of the pre-amplifying transistor 41 cannot be increased. Therefore, it becomes possible to control the output level of the RF signal only in the range in which the gain control voltage applied to the gain-control-voltage supply terminal 58 is from 0.5 to 0.8 V. There arises the problem that the varying range of the gain control voltage capable of controlling the output level of the RF signal is narrow, and in addition, the linearity of the varying of the output level of the RF signal with respect to the variation in the gain control voltage is not satisfactory.

In addition to this, it is possible that instead of varying the gain of the pre-amplifying transistor 41 by the gain control voltage, the above-described known gain-control-type transistor power amplifier may adopt control means that cause the gain of the power amplifying transistor 42 to be varied or may adopt control means that cause the gain of the pre-amplifying transistor 41 and the gain of the power amplifying transistor 42 in combination to be varied by the gain control voltage. If the former control means is adopted, there arises the problem that the distortion ratio of the RF signal increases during gain control, and spurious components increase. If the latter control means is adopted, there arises the problem that the construction of the circuit which performs gain control becomes complex when there is a difference between the gain of the pre-amplifying transistor 41 and the gain of the power amplifying transistor 42.

SUMMARY OF THE INVENTION

The present invention solves these problems. An object of the present invention is to provide a gain-control-type transistor power amplifier in which the varying range of a gain control voltage capable of controlling the output level of the RF signal is extended and which performs gain control in a state in which there is satisfactory linearity.

To achieve the above-described object, the gain-control-type transistor power amplifier of the present invention comprises means which supply a gain control voltage to the base of an amplifying transistor via a control transistor which is emitter-follower-connected and which causes the base bias voltage of the amplifying transistor to vary by the gain control voltage at that time so that the gain of the amplifying transistor is controlled.

According to the above-described means, a gain control voltage is supplied to the base of the amplifying transistor from the emitter of the emitter-follower-connected control transistor having a low-output impedance characteristic, making it possible to supply a relatively large base bias current and further to set the lowest voltage of the supplied gain control voltage by the emitter voltage of the control transistor. Therefore, it becomes possible to control the output level of the RF signal over the almost entire region of the varying range of the gain control voltage, making it possible to lessen the variation in the output level of the RF signal with respect to the variation in the gain control voltage so that the linearity when the output level of the RF signal varies is improved.

In the present invention, a gain-control-type transistor power amplifier comprises an amplifying transistor, to the base of which a bias voltage and a signal are supplied, and a control transistor, to the base of which a gain control voltage is supplied. The gain-control-type transistor power amplifier supplies the gain. control voltage output from the emitter of the control transistor to the base of the amplifying transistor and the bias voltage is varied by the supplied gain control voltage so that the gain of the amplifying transistor is controlled.

Preferably, the emitter of the control transistor is connected to the base of the amplifying transistor via a resistor.

According to the present invention, a gain control voltage is supplied to the base of the amplifying transistor from the emitter of the control transistor which is emitter-follower-connected having a low-output impedance characteristic, making it possible not only to supply a relatively large base bias current based on the gain control voltage and further to set the lowest voltage of the supplied gain control voltage by the emitter voltage of the control transistor. Therefore, it becomes possible to control the output level of the RF signal corresponding to the magnitude of the gain control voltage over the almost entire region of the varying range of the gain control voltage, that is, from the lowest voltage to the highest voltage. Further, since the output level of the RF signal is controlled over the almost entire region of the varying range of the gain control voltage, the variation in the output level of the RF signal with respect to the variation in the gain control voltage moderates, improving the linearity when the output level of the RF signal varies.

The above and further objects, aspects and novel features of the invention will become more apparent from the following detailed description when read in connection with the accompanying drawings.

DESCRIPTION OF THE PREFERRED EMBODIMENT

An embodiment of the present invention will be described below with reference to the accompanying drawings.

Figure 1:
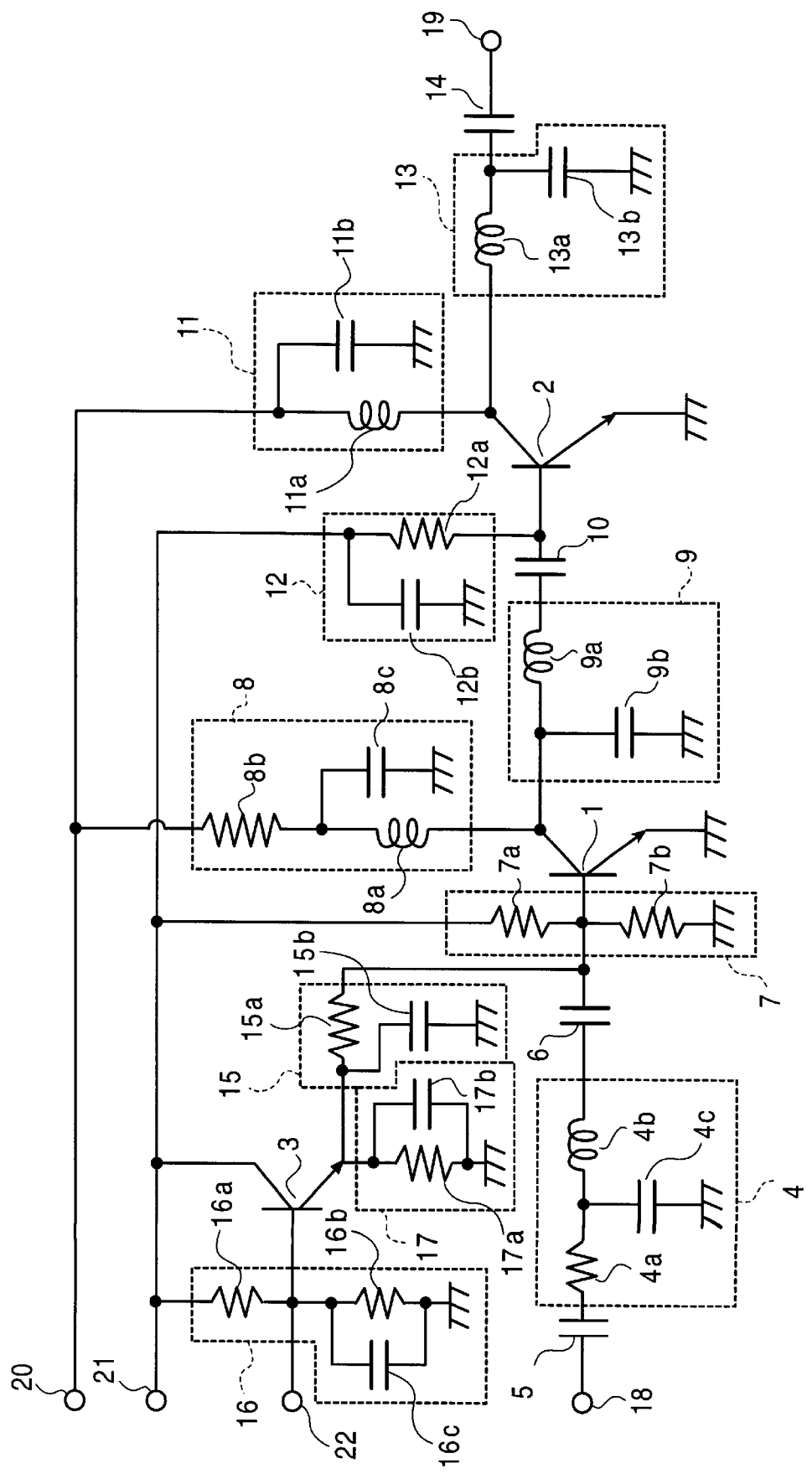
FIG. 1 is a circuit diagram illustrating an embodiment of a gain-control-type transistor power amplifier according to the present invention.

FIG. 1 is a circuit diagram illustrating an embodiment of a gain-control-type transistor power amplifier according to the present invention, also illustrating an example in which the gain-control-type transistor power amplifier is a power amplifier for transmission disposed in a transmission and receiving unit of a digital cordless telephone set.

As shown in FIG. 1, the gain-control-type transistor power amplifier comprises a pre-amplifying transistor 1 which is emitter-grounded, a power amplifying transistor 2 which is similarly emitter-grounded, a control transistor 3 which is emitter-follower-connected, an input filter circuit 4 formed of a series resistor 4a, a series inductor 4b and a branch capacitor 4c, first and second coupling capacitors 5 and 6, a first base bias circuit 7 formed of base bias resistors 7a and 7b, a first collector load 8 formed of a series-connected inductor 8a, a resistor 8b and a branch capacitor 8c, an interstage filter circuit 9 formed of a series inductor 9a and a branch capacitor 9b, a third coupling capacitor 10, a second collector load 11 formed of a series inductor 11a and a branch capacitor 11b, a second base bias circuit 12 formed of a series inductor 12a and a branch capacitor 12b, an output filter circuit 13 formed of a series inductor 13a and a branch capacitor 13b, a fourth coupling capacitor 14, a third base bias circuit 15 formed of a series inductor 15a and a branch capacitor 15b, a fourth base bias circuit 16 formed of base bias resistors 16a and 16b and a by-pass capacitor 16c, an emitter load 17 formed of an emitter resistor 17a and an emitter by-pass load 17b, a signal input terminal 18, a signal output terminal 19, a power terminal 20 on the high voltage side, a power terminal 21 on the low voltage side, and a gain-control-voltage supply terminal 22.

The base of the pre-amplifying transistor 1 is connected to the signal input terminal 18 via the second coupling capacitor 6, the input filter circuit 4 and the first coupling capacitor 5, and at the same time connected to the emitter of the control transistor 3 via the third base bias circuit 15 and connected to the power terminal 21 on the low voltage side via the first base bias circuit 7. The collector of the pre-amplifying transistor 1 is connected to the power terminal 20 on the high voltage side via the first collector load 8 and further connected to the base of the power amplifying transistor 2 via the interstage filter circuit 9 and the third coupling capacitor 10. The power amplifying transistor 2 is connected at its base to the power terminal 21 on the low voltage side via the second base bias circuit 12 and connected at its collector to the power terminal 20 on the high voltage side via the second collector load 11, and further connected to the signal output terminal 19 via the output filter circuit 13 and the fourth coupling capacitor 14. The control transistor 3 is connected at its base to the gain-control-voltage supply terminal 22 and further connected to the power terminal 21 on the low voltage side via the fourth base bias circuit 16, and directly connected at its collector to the power terminal 21 on the low voltage side and connected at its emitter to a ground via the emitter load 17.

In this case, a radio frequency signal ("RF signal") to be amplified is supplied to the signal input terminal 18, and the amplified RF signal is output from the signal output terminal 19. A relatively high power voltage is supplied to the power terminal 20 on the high voltage side, and a relatively low power voltage is supplied to the power terminal 21 on the low voltage side. A gain control voltage which varies in response to the received signal intensity is supplied to the gain-control-voltage supply terminal 22, and the varying range of the gain control voltage is, for example, from 0 to 1.5 V.

Further, each resistance value of the base bias resistors 7a and 7b which form the first base bias circuit 7, each resistance value of the base bias resistors 16a and 16b which form the fourth base bias circuit 16, and the resistance value of the emitter resistor 17a which forms the emitter load 17 are selected so that the base bias voltage of the pre-amplifying transistor 1 when a gain control voltage is not supplied to the gain-control-voltage supply terminal 22 is set to become almost equal to the emitter voltage of the control transistor 3 when a gain control voltage is also not supplied.

The gain-control-type transistor power amplifier constructed as described above operates as described below.

An RF signal to be amplified, which is applied to the signal input terminal 18, is supplied to the base of the pre-amplifying transistor 1 via the first coupling capacitor 5, the input filter circuit 4 and the second coupling capacitor 6, and is pre-amplified by the pre-amplifying transistor 1 and then output from the collector thereof. The amplification gain of the pre-amplifying transistor 1 at this time becomes a variable gain, which is dependent on the magnitude of the gain control voltage applied to the gain-control-voltage supply terminal 22 and supplied to the base via the control transistor 3. Then, the RF signal pre-amplified by the pre-amplifying transistor 1 is supplied to the base of the power amplifying transistor 2 via the interstage filter circuit 9 and the third coupling capacitor 10, and is power-amplified by the power amplifying transistor 2 and output from the collector thereof. The amplification gain of the power amplifying transistor 2 in this case becomes a fixed gain which is dependent on a power voltage applied to the power terminal 21 on the low voltage side. Then, the RF signal which is power-amplified by the power amplifying transistor 2 is supplied to the signal output terminal 19 via the output filter circuit 13 and the fourth coupling capacitor 14, is supplied from the signal output terminal 19 through a transmission and receiving select switch (not shown) to an antenna (also not shown), from which the signal is transmitted.

At this time, the gain control voltage applied to the gain-control-voltage supply terminal 22 is supplied to the control transistor 3 whereby the gain control voltage is amplified and output from the emitter, after which the gain control voltage is supplied to the base of the pre-amplifying transistor 1 via the third base bias circuit 15. The gain control voltage supplied to the base of the pre-amplifying transistor 1 causes the base bias voltage set by the first base bias circuit 7 to vary in response to the magnitude of the gain control voltage, thereby varying the gain of the pre-amplifying transistor 1. Also in this embodiment, the gain control voltage varies in response to the received signal level (received signal intensity) received by the receiving section of the digital cordless telephone set. When the received signal intensity is large, the gain control voltage decreases. When, on the other hand, the received signal intensity is small, the gain control voltage increases. The varying range is in a range from 0 to 1.5 V. When the gain control voltage varies within the range from 0 to 1.5 V, the output level of the RF signal varies as described below.

Figure 2:
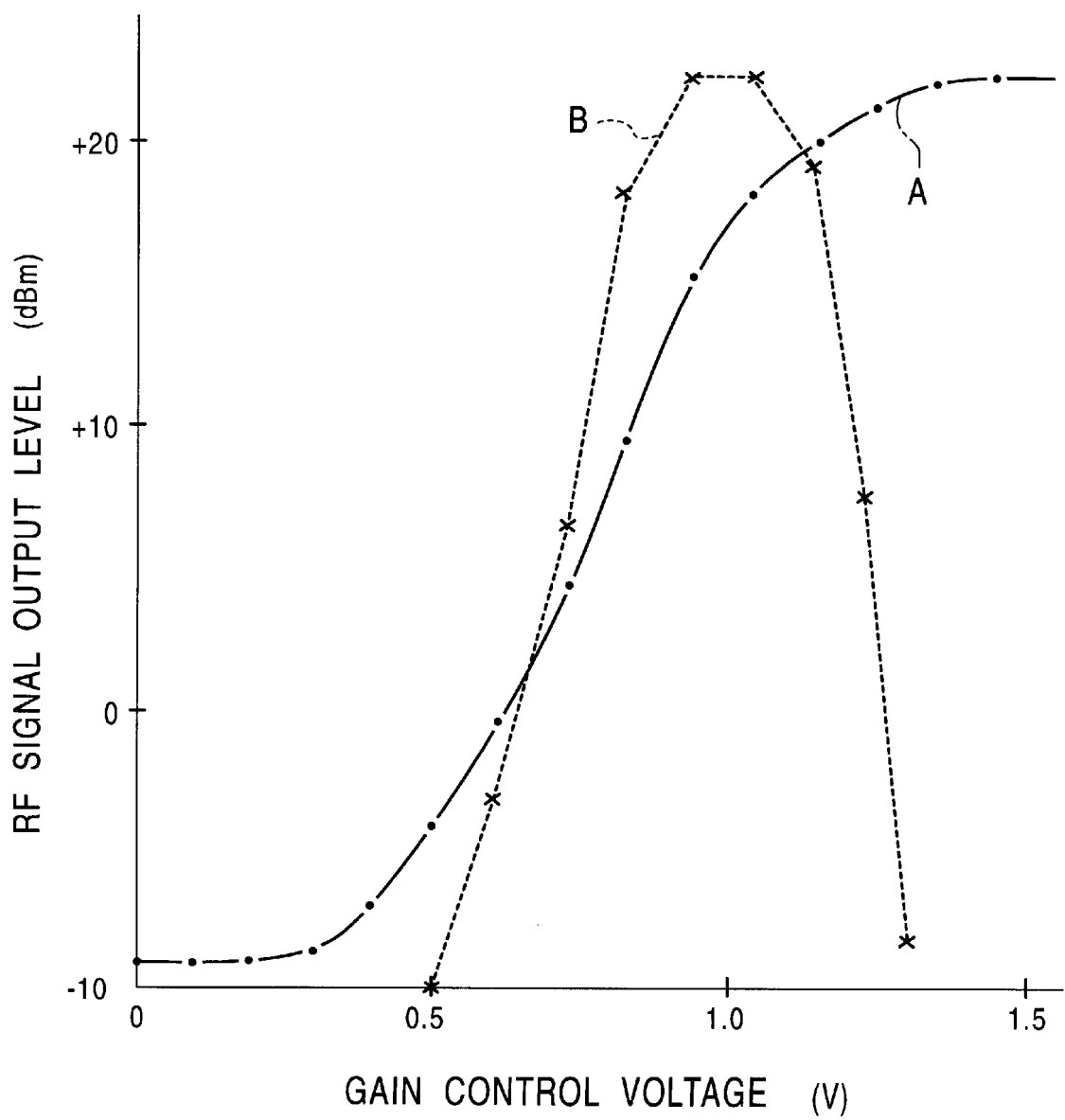
FIG. 2 is a characteristic view illustrating an example of the relationship between a gain control voltage and an output signal level in the gain-control-type transistor power amplifier according to the present invention.

First, when the gain control voltage applied to the gain-control-voltage supply terminal 22 is from 0 to 0.3 V, the sum of the gain control voltage and the base bias voltage set by the fourth base bias circuit 16 does not reach the voltage such that the base-emitter junction voltage (Vbe) of the control transistor 3 is added to the set emitter voltage of the control transistor 3. Therefore, as indicated by curve A of FIG. 3, the base voltage of the pre-amplifying transistor 1 is limited to approximately 0.25 V, causing the pre-amplifying transistor 1 to be placed in a quasi-cut-off state. As indicated by curve A of FIG. 2, an RF signal at a level of about −10 dBm is output from the signal output terminal Next, when the gain control voltage applied to the gain-control-voltage supply terminal 22 exceeds 0.3 V, as indicated by curve A of FIG. 3, the sum of the gain control voltage and the base bias voltage set by the fourth base bias circuit 16 slightly exceeds the voltage such that the base-emitter junction voltage (Vbe) of the control transistor 3 is added to the set emitter voltage of the control transistor 3. The base voltage of the pre-amplifying transistor 1 increases sequentially with an increase in the gain control voltage, and in response to this, as indicated by curve A of FIG. 2, the RF signal level output from the signal output terminal 19 increases sequentially.

Figure 3:
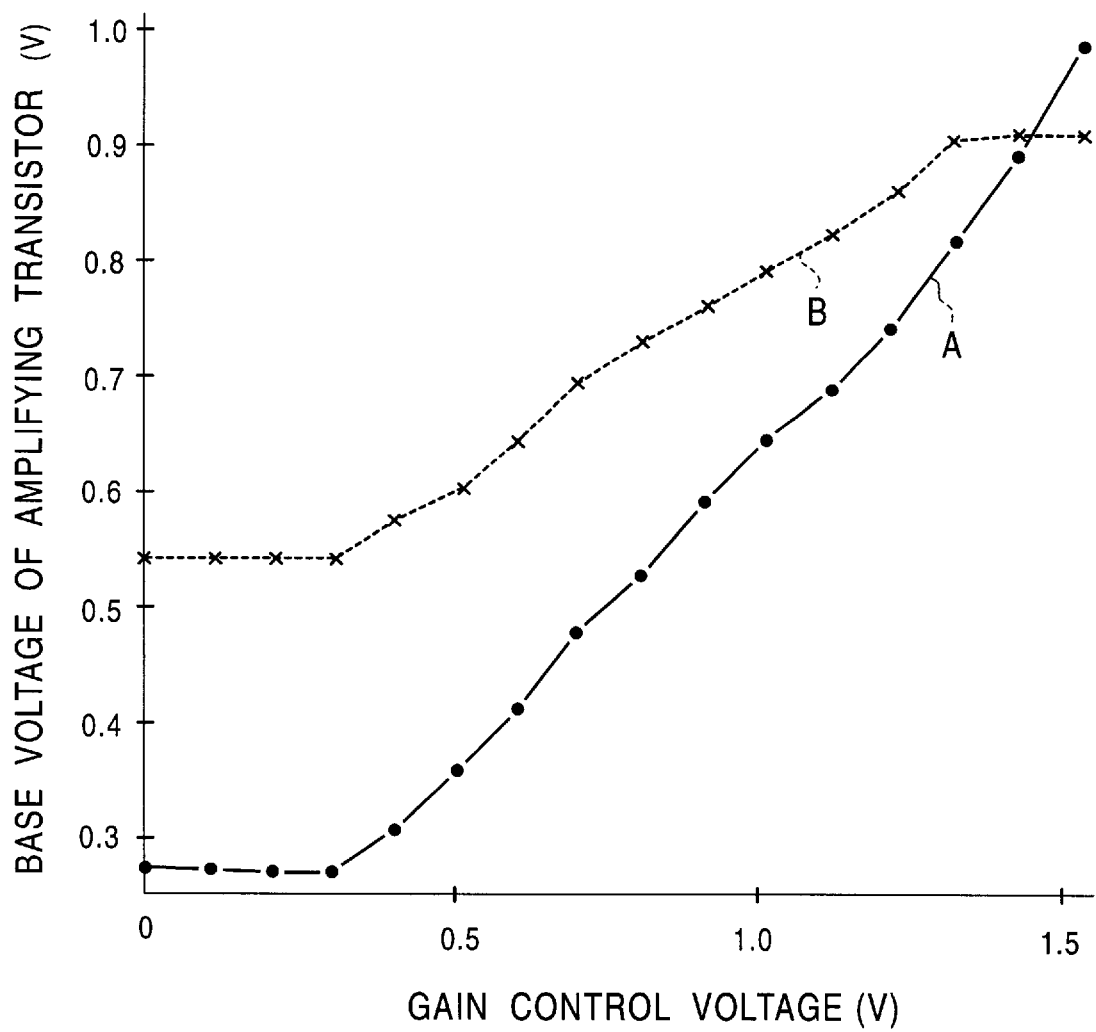
FIG. 3 is a characteristic view illustrating an example of the relationship between a gain control voltage and a base voltage of an amplifying transistor in the gain-control-type transistor power amplifier according to the present invention.
Figure 4:
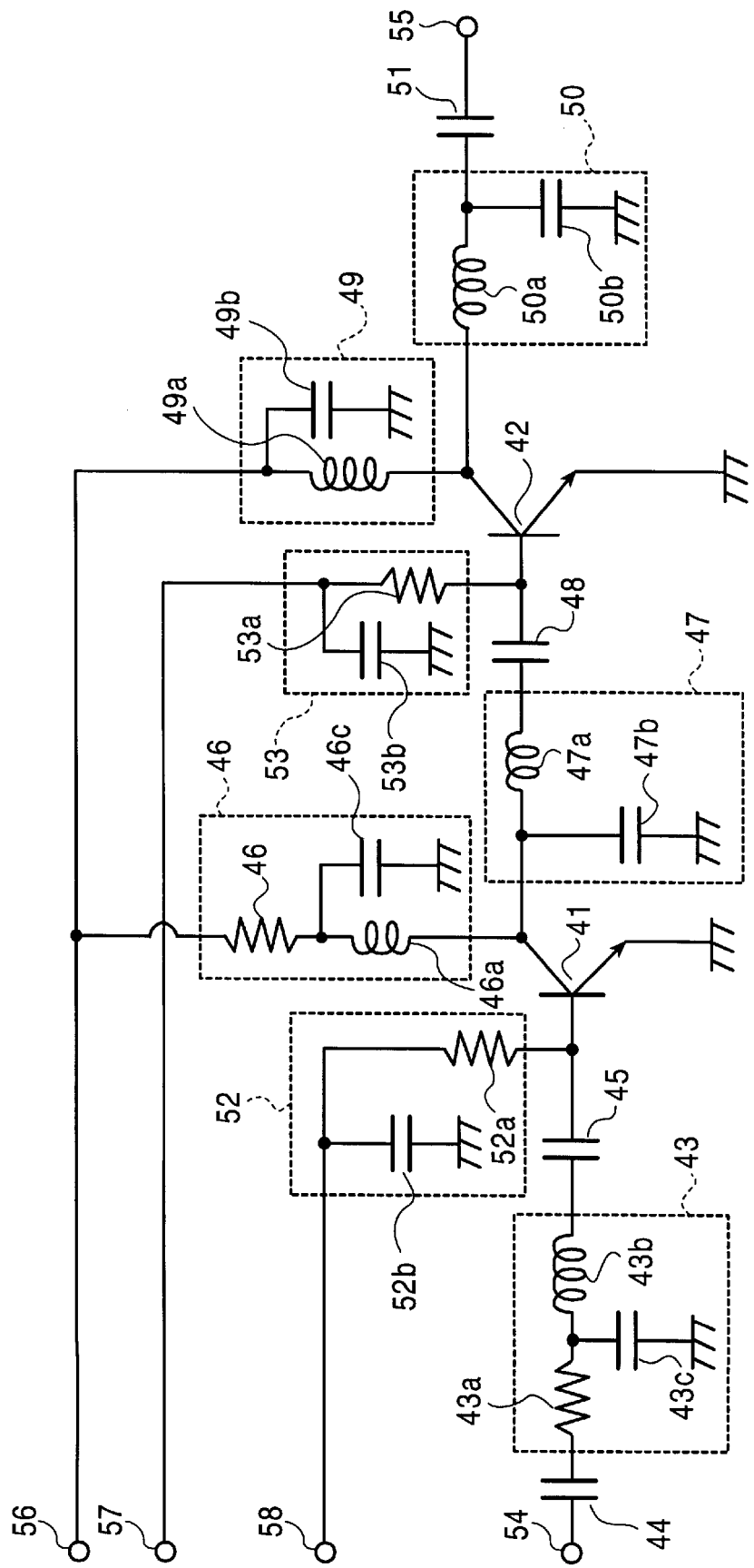
FIG. 4 is a circuit diagram illustrating an example of a conventional gain-control-type transistor power amplifier.

While the gain control voltage applied to the gain-control-voltage supply terminal 22 is from about 0.5 V to about 1.2 V, as indicated by curve A of FIG. 3, the sum of the gain control voltage and the base bias voltage set by the fourth base bias circuit 16 increases sequentially to more than the voltage such that the base-emitter junction voltage (Vbe) of the control transistor 3 is added to the set emitter voltage of the control transistor 3. In response to this, as indicated by curve A of FIG. 2, the RF signal level output from the signal output terminal 19 also increases roughly linearly in near proportion to the increasing gain control voltage.

Further, when the gain control voltage applied to the gain-control-voltage supply terminal 22 exceeds 1.2 V, as indicated by curve A of FIG. 3, the sum of the gain control voltage and the base bias voltage set by the fourth base bias circuit 16 continues to sequentially increase to more than the voltage such that the base-emitter junction voltage (Vbe) of the control transistor 3 is added to the set emitter voltage of the control transistor 3. As indicated by the curve A of FIG. 2, the rate of increase in response to an increase in the gain control voltage decreases sequentially. When the gain control voltage applied to the gain-control-voltage supply terminal 22 increases to about 1.3 V, the RF signal level approaches a saturated state in which the RF signal level output from the signal output terminal 19 hardly increases with an increase in the gain control voltage.

As described above, according to the gain-control-type transistor power amplifier of this embodiment, when the gain control voltage applied to the gain-control-voltage supply terminal 22 is in a range from 0.3 to 1.2 V, it is possible to control the output level of the RF signal output from the signal output terminal 19 within a range from −10 to +20 dBm. In comparison with this type of conventional gain-control-type transistor power amplifier, the range of the gain control voltage capable of controlling the output level of the RF signal can be greatly extended, and further, it is possible to make the variation of the output level of the RF signal caused by a variation in the gain control voltage nearly linear.

Although in this embodiment an example is described in which the gain-control-type transistor power amplifier is a gain-control-type transistor power amplifier for use in the transmission section of a subphone of a digital cordless telephone set, the gain-control-type transistor power amplifier of the present invention is not limited to a gain-control-type transistor power amplifier for use in the transmission section of a subphone of a digital cordless telephone set and, of course, can be applied in a similar manner to an RF signal amplifier of other apparatus.

The circuit components of the gain-control-type transistor power amplifier described in this embodiment only show an example of the circuit components of the gain-control-type transistor power amplifier of the present invention. Various circuit components used in an RF signal transmission line can be changed, added, or deleted appropriately, and further, changing of components, such as a base bias circuit, a collector load circuit or an emitter load circuit, can be performed appropriately.

As has been described up to this point, according to the present invention, a gain control voltage is supplied to the base of an amplifying transistor from the emitter of a control transistor which is emitter-follower-connected having a low-output impedance characteristic, making it possible to supply a relatively large base bias current based on a gain control voltage and further to set the lowest voltage of the supplied gain control voltage by the emitter voltage of the control transistor. Therefore, it becomes possible to control the output level of the RF signal over the almost entire region of the varying range of the gain control voltage, that is, from the lowest voltage to the highest voltage, and thus there is an advantage that the varying state of the output level of the RF signal with respect to the variation in the gain control voltage can be made to be a moderate linear form.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A gain-control-type transistor power amplifier, comprising:

an amplifying transistor, to the base of which a bias voltage and a signal are supplied;

a control transistor, to the base of which a gain control voltage is supplied, wherein a gain control voltage output from the emitter of said control transistor is supplied to the base of said amplifying transistor, and said bias voltage is varied by said supplied gain control voltage so that the gain of said amplifying transistor is controlled;

a first fixed bias voltage applied to the base of said amplifying transistor, said first fixed bias voltage applied to a first voltage divider wherein said first voltage divider is connected to a power terminal to which a D.C. voltage is supplied; and said gain control voltage output from said control transistor is interposed as a variable bias voltage into said first fixed bias voltage.

2. A gain-control-type transistor power amplifier according to claim 1, wherein the emitter of said control transistor is connected to the base of said amplifying transistor via a resistor;

a second fixed bias voltage applied to the base of said control transistor, said second fixed bias voltage applied to a second voltage divider wherein said second voltage divider is connected to said D.C. voltage;

wherein said power terminal is connected to the collector of said control transistor; and wherein the emitter of said control transistor is connected to ground via a resistor.

* * * * *